(12) United States Patent
Yang

(10) Patent No.: US 9,412,612 B2
(45) Date of Patent: Aug. 9, 2016

(54) METHOD OF FORMING SEMICONDUCTOR DEVICE

(71) Applicant: MACRONIX International Co., Ltd., Hsinchu (TW)

(72) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 62 days.

(21) Appl. No.: 14/473,220

(22) Filed: Aug. 29, 2014

(65) Prior Publication Data
US 2016/0064237 A1    Mar. 3, 2016

(51) Int. Cl.
*G03F 7/26* (2006.01)
*H01L 21/308* (2006.01)

(52) U.S. Cl.
CPC ........ *H01L 21/3086* (2013.01); *H01L 21/3088* (2013.01)

(58) Field of Classification Search
CPC ........................................................ G03F 7/26
See application file for complete search history.

(56) References Cited

U.S. PATENT DOCUMENTS

| 7,687,408 B2* | 3/2010 | Abatchev | H01L 21/0332 257/E21.033 |
|---|---|---|---|
| 2014/0045125 A1* | 2/2014 | Tran | H01L 21/0337 430/319 |

\* cited by examiner

*Primary Examiner* — Kathleen Duda
(74) *Attorney, Agent, or Firm* — J.C. Patents

(57) ABSTRACT

A method of forming a semiconductor device is disclosed. A substrate having a first area and a second area is provided. A target layer and a hard mask layer are sequentially formed on the substrate in the first area and in the second area. Transfer patterns are formed in a spacer form on the hard mask layer in the first area. A photoresist layer is formed directly on the hard mask layer, and covers the transfer patterns and the hard mask layer in the first area and in the second area. The photoresist layer in the first area is removed. The hard mask layer is patterned by using the transfer patterns as a mask.

20 Claims, 4 Drawing Sheets

METHOD OF FORMING SEMICONDUCTOR DEVICE

BACKGROUND OF THE INVENTION

1. Field of Invention

The present invention relates to an integrated circuit (IC) process, and particularly to a method of forming a semiconductor device.

2. Description of Related Art

As the level of integration of a non-volatile memory is getting higher, the critical dimension of the same is getting smaller. Minimizing the critical dimension and increasing the level of integration have become the mainstream in the industry, and the key technology is in photolithography.

In the photolithography stage, reducing a pitch to less than 38 nm in the current state of technology is rather difficult even by immersion 193 nm (ArF) scanner combined with a self-aligned double patterning (SADP) process, unless a light source having a shorter wavelength (for example, by 13 nm EUV scanner) and a corresponding photoresist are used. However, it is very costly to replace existing machines entirely with new machines for this purpose. Thereafter, a double spacer forming technique such as a self-aligned quadruple patterning (SAQP) process is developed.

In the SADP or SAQP process, two spacers are provided beside each core pattern, and the spacers are usually formed with tilted sidewalls. In such case, the adjacent spacers are easily connected and merged in the subsequent patterning process. Accordingly, how to resolve the spacer merge issue and thereby improve the device performance has been drawn attention in the industry.

SUMMARY OF THE INVENTION

The present invention provides a method of forming a semiconductor device, with which the conventional spacer merge issue can be successfully resolved, and the device performance can be accordingly improved.

The present invention provides a method of forming a semiconductor device. A substrate having a first area and a second area is provided. A target layer and a hard mask layer are sequentially formed on the substrate in the first area and in the second area. Transfer patterns are formed in a spacer form on the hard mask layer in the first area. A photoresist layer is formed directly on the hard mask layer, and covers the transfer patterns and the hard mask layer in the first area and in the second area. The photoresist layer in the first area is removed. The hard mask layer is patterned by using the transfer patterns as a mask.

According to an embodiment of the present invention, a BARC layer is not applied before the step of forming the photoresist layer and after the step of forming the transfer patterns.

According to an embodiment of the present invention, the hard mask layer includes the hard mask layer includes amorphous silicon, polysilicon, silicon carbonitride, carbon, TiN or a combination thereof.

According to an embodiment of the present invention, the hard mask layer has an absorption value at 193 nm exposure wavelength is greater than about 2.

According to an embodiment of the present invention, the hard mask layer has a thickness of equal to or greater than about 30 nm.

According to an embodiment of the present invention, the transfer patterns have an aspect ratio of about 5 to 10.

According to an embodiment of the present invention, the step of forming the transfer patterns in the spacer form includes forming a plurality of core patterns on the hard mask layer; forming a transfer material layer on the hard mask layer covering the core patterns; removing a portion of the transfer material layer, so as to form two transfer patterns as spacers on sidewalls of each core pattern; and removing the core patterns.

According to an embodiment of the present invention, an etch selectivity of the transfer patterns to the core patterns ranges from about 1/2 to 1/10.

According to an embodiment of the present invention, an etch selectivity of the transfer patterns to the hard mask layer ranges from about 1/2 to 1/10.

According to an embodiment of the present invention, the step of removing the photoresist layer in the first area includes performing an exposure step and a development step to the photoresist layer.

According to an embodiment of the present invention, the photoresist layer upon the development step defines at least one photoresist pattern in the second area.

According to an embodiment of the present invention, the first area is an array area and the second area is a periphery area.

According to an embodiment of the present invention, the target layer includes a conductive layer, a dielectric layer or a combination thereof.

The present invention further provides a method of forming a semiconductor device. An opaque hard mask layer is formed on a target layer. A plurality of separate transfer patterns is formed on the hard mask layer, wherein the transfer patterns have slightly tilted sidewalls. A photoresist layer is coated directly on the hard mask layer covering the transfer patterns. An exposure step and a development step are performed to the photoresist layer, so as to expose the transfer patterns, wherein the transfer patterns have the same slightly tilted sidewalls upon the development step.

According to an embodiment of the present invention, a BARC layer is not applied before the step of coating the photoresist layer and after the step of forming the transfer patterns.

According to an embodiment of the present invention, the hard mask layer has an absorption value at 193 nm exposure wavelength is greater than about 2.

According to an embodiment of the present invention, the hard mask layer has a thickness of equal to or greater than about 30 nm.

According to an embodiment of the present invention, the transfer patterns have an aspect ratio of about 5 to 10.

According to an embodiment of the present invention, the step of forming the transfer patterns includes forming a plurality of core patterns on the hard mask layer; forming a transfer material layer on the hard mask layer covering the core patterns; removing a portion of the transfer material layer, so as to form two transfer patterns as spacers on sidewalls of each core pattern; and removing the core patterns.

According to an embodiment of the present invention, the photoresist layer upon the development step defines at least one photoresist pattern in a periphery area.

In view of the foregoing, in the method of the invention, a BARC layer is not used during the periphery pattern defining step, so that voids and therefore spacer merge issue caused by incomplete BARC filling are not observed in the array patterns. Thus, the pitch reduction can be successfully achieved, and the device performance can be significantly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
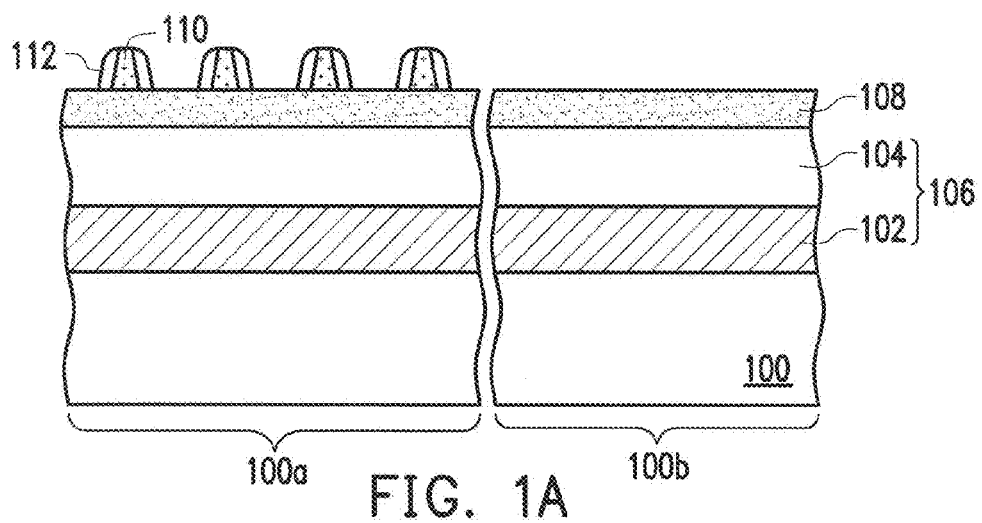
FIG. 1A to FIG. 1E are schematic cross-sectional views of a method of forming a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1E are schematic cross-sectional views of a method of forming a semiconductor device according to an embodiment of the present invention.

Referring to FIG. 1A, a substrate 100 is provided. The substrate 100 can be a semiconductor substrate, such as a silicon-containing substrate. The substrate 100 has a first area 100a and a second area 100b. In an embodiment, the first area 100a can be an array area, and the second area 100b can be a periphery area. In another embodiment, the first area 100a can be a dense area, and the second area 100b can be an isolated area.

Thereafter, a target layer 106 and a hard mask layer 108 are sequentially formed on the substrate 100 in the first area 100a and in the second area 100b. The target layer 106 includes a conductive material, a dielectric material or a combination thereof. The conductive material includes polysilicon or metal (e.g. Al or Cu), and the dielectric material includes silicon oxide, silicon nitride, silicon oxynitride or a combination thereof. The method of forming the target layer 106 includes performing at least one suitable deposition process, e.g. PVD, CVD or ALD. Besides, the target layer 106 can be a single layer or a multi-layer structure. In an embodiment, the target layer 106 can be a stacked structure including a lower polysilicon layer 102 and an upper oxide layer 104, as shown in FIG. 1A.

The hard mask layer 108 includes amorphous silicon, polysilicon, silicon carbonitride, carbon, TiN or a combination thereof. In an embodiment, the hard mask layer 108 has an absorption value (k) at 193 nm exposure wavelength is greater than about 2. The hard mask layer 108 is preferably opaque and thick enough, so the light reflection from the underlying layers could keep a stable value and not change even though the refractive index (n), absorption value (k) and thickness (t) of each of the underlying layers are varied during a subsequent exposure step. In such case, due to the stable light reflection value, the critical dimension and profile of the resist pattern can be easily controlled. The hard mask layer 108 can have a thickness of equal to or greater than about 30 nm. In an embodiment, the hard mask layer 108 can be a polysilicon layer of 30 nm thick.

Afterwards, a plurality of core patterns 110 (or called mandrel patterns) is formed on the hard mask layer 108 in the first area 100a. The core patterns 110 includes SiN, carbon or Advanced Pattering Film™ (APF) available from Applied Material, Inc. of Santa Clara, Calif. The method of forming the core patterns 110 includes performing a deposition step followed by photolithography and etching steps. Due to certain process factors such as etch micro-loading effects and high polymer deposition during the etching step, each core pattern 110 may be formed with a trapezoid shape having a slightly tilted sidewall.

Continue referring to FIG. 1A, two transfer patterns 112 as spacers are formed on sidewalls of each core pattern 110. The transfer patterns 112 include silicon oxide or a suitable conformal material. The transfer patterns 112 has an etch selectivity to the core patterns 110 and the underlying hard mask layer 108. Specifically, the etch selectivity of the transfer patterns 112 to the core patterns 110 ranges from 1/2 to 1/10, and the etch selectivity of the transfer patterns 112 to the hard mask layer 108 ranges from 1/2 to 1/10. The method of forming the transfer patterns 112 includes forming a transfer material layer (not shown) on the hard mask layer 108 covering the core patterns 110, and then removing a portion of the transfer material layer. The removing process includes an anisotropic etching step and a loop breaking step.

Figure 1B:
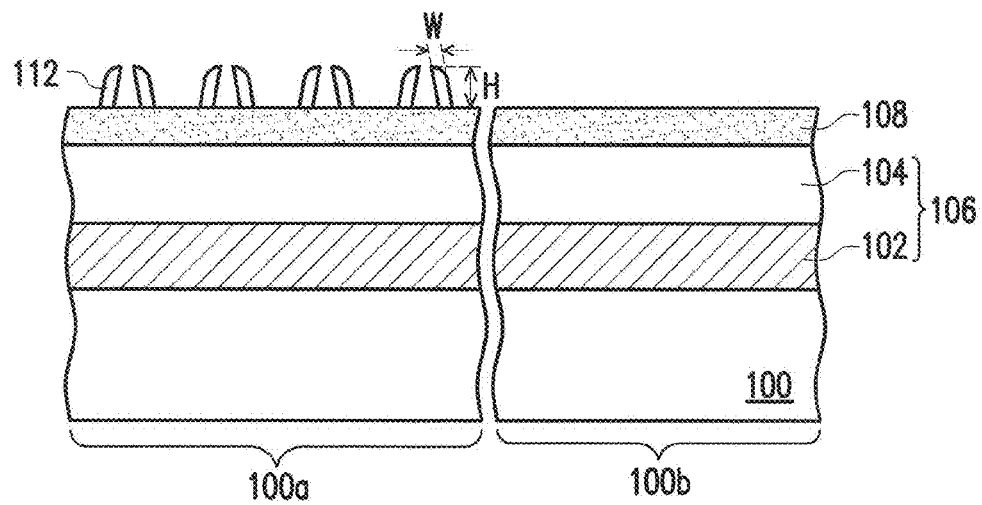

Referring to FIG. 1B, the core patterns 110 are removed through an etching step. The transfer patterns 112 in a spacer form are accordingly provided on the hard mask layer 108 in the first area 100a. In an embodiment, the separate transfer patterns 112 are formed with slightly tilted sidewalls, and the adjacent transfer patterns 112 are tilted toward each other with respect to the central core pattern 110. The transfer patterns 112 have a width/height aspect ratio of about 5 to 10. Specifically, each transfer pattern 112 has a height H and a width W, and the aspect ratio thereof is defined as the ratio of width to height (W/H). In an embodiment, the pitch of the transfer patterns 112 ranges from about 19 to 38 nm.

Figure 1C:
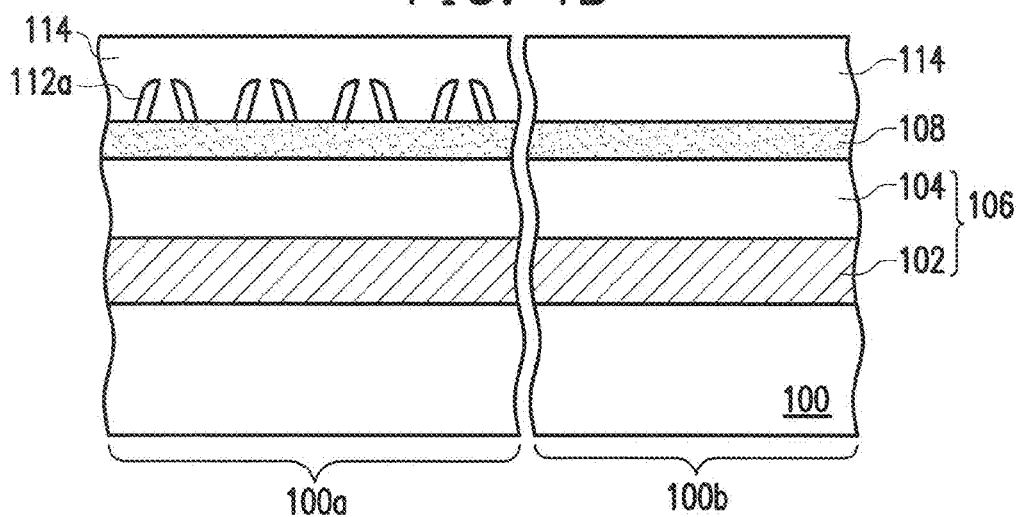

Referring to FIG. 1C, a photoresist layer 114 is formed directly on the hard mask layer 108 and covers the transfer patterns 112 and the hard mask layer 108 in the first area 100a and in the second area 100b. Due to the weight/stress from the photoresist layer 114 per se, the transfer patterns 112a are more tilted than the original. Specifically, as compared to the transfer patterns 112 in FIG. 1B, the adjacent transfer patterns 112a in FIG. 1C are more tilted toward each other with respect to the central core pattern 110 after the photoresist layer 114 is formed thereon.

The photoresist layer 114 includes a positive photoresist material or a negative photoresist material. In an embodiment, the photoresist layer 114 can be a 365 nm (I-line) photoresist, a 248 nm (KrF) photoresist, a 193 nm (ArF) photoresist or a immerion-193 nm (immersion-ArF) photoresist based on the periphery design rule and overlay specification. The method of forming the photoresist layer includes performing an adhesion treatment step, a spin coating step and a soft baking (SB) step in sequence. Besides, a viscosity builder such as hexamethyldisilazane (HMDS) is sprayed on the wafer during the adhesion treatment step, so as to enhance the adhesion between the photoresist layer 114 and the hard mask layer 108.

Figure 2:
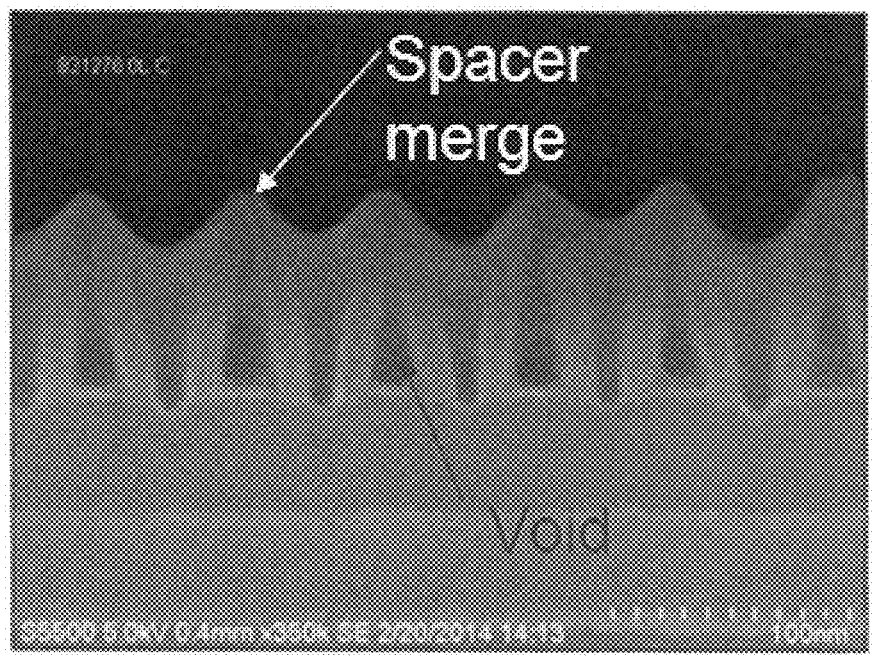
FIG. 2 is a scanning electron microscopy (SEM) picture of conventional transfer patterns upon BARC coating steps.
Figure 3:
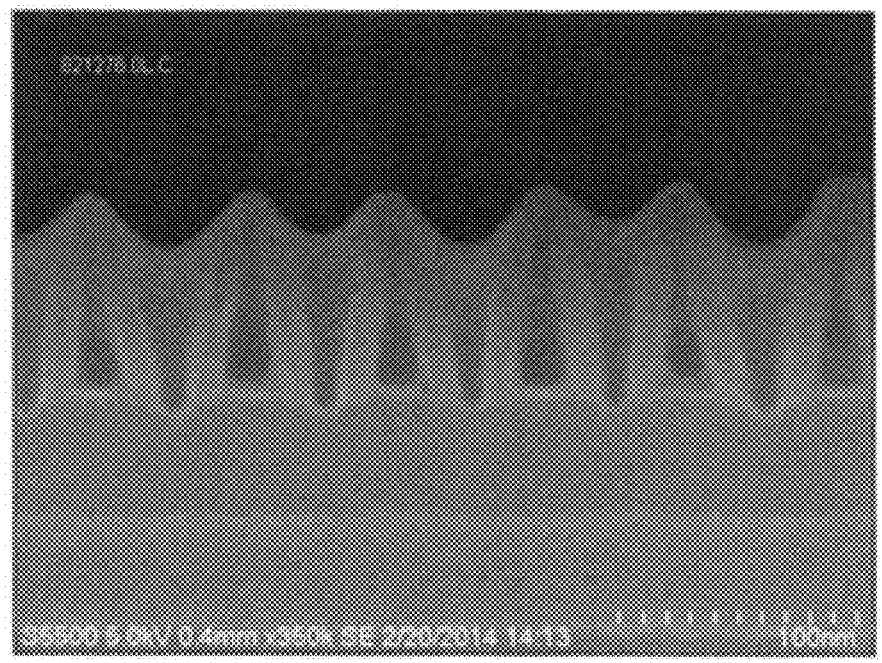
FIG. 3 is a SEM picture of the conventional transfer patterns upon a development step.

It is noted that in the present invention, a bottom anti-reflection coating (BARC) layer is not applied before the step of forming the photoresist layer 114 and after the step of forming the transfer patterns 112, and in such manner, the conventional spacer merge issue can be avoided. Specifically, in the conventional method, a BARC layer and a photoresist layer are sequentially formed on the hard mask layer filling in the dense patterns (e.g. transfer patterns). However, due to the high aspect-ratio pattern, small pattern pitch and asymmetric profile of spacer pattern, the BARC layer is unable to completely fill the gaps between patterns, and thus, voids are generated between the adjacent patterns tilted toward each other, as shown in FIG. 2. The BARC layer is also not thick enough to generate a flat surface after the BARC coating. The stress of the patterns is not uniform due to the presence of voids, so that the adjacent patterns are tilted more toward each other and even connected and merged after baking, as shown in FIG. 2. The conventional transfer patterns are still connected and merged after the subsequent exposure and development steps, as shown in FIG. 3.

Figure 4:
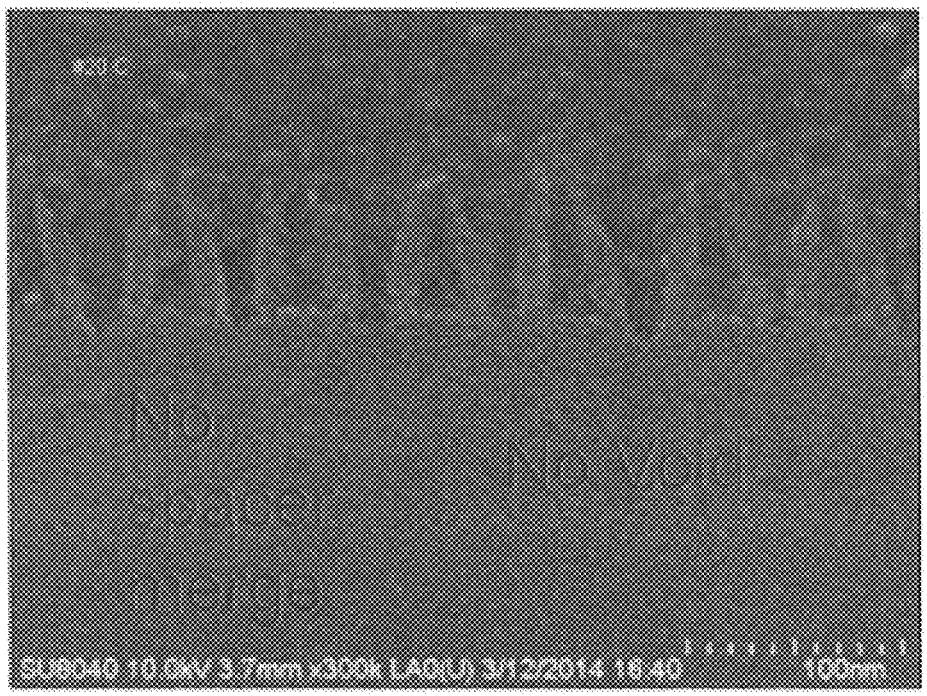
FIG. 4 is a SEM picture of transfer patterns of the invention upon a photoresist coating step.
Figure 5:
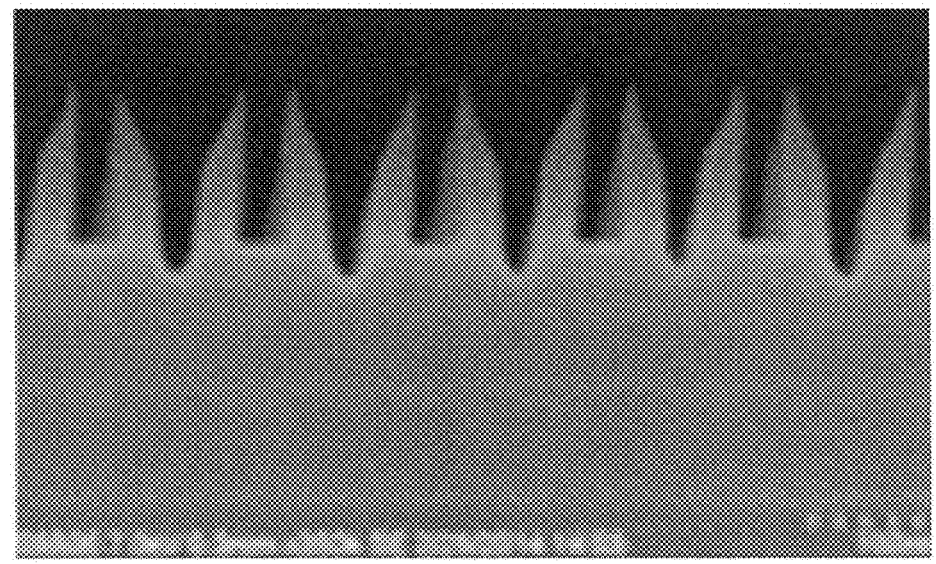
FIG. 5 is a SEM picture of the transfer patterns of the invention upon a development step.

On the contrary, in the present invention, since a BARC layer is not applied before the step of forming the photoresist layer 114, voids and therefore spacer merge issue are not observed. Upon the photoresist coating step, as shown in FIG. 1C and FIG. 4, the sidewalls of the transfer patterns 112a are more tilted than the original, but no void is present between the adjacent transfer patterns 112a. The photoresist thickness is much higher than the height H of the transfer patterns 112, so the photoresist layer 114 can be formed with a flat topography after the coating and baking steps.

Figure 1D:
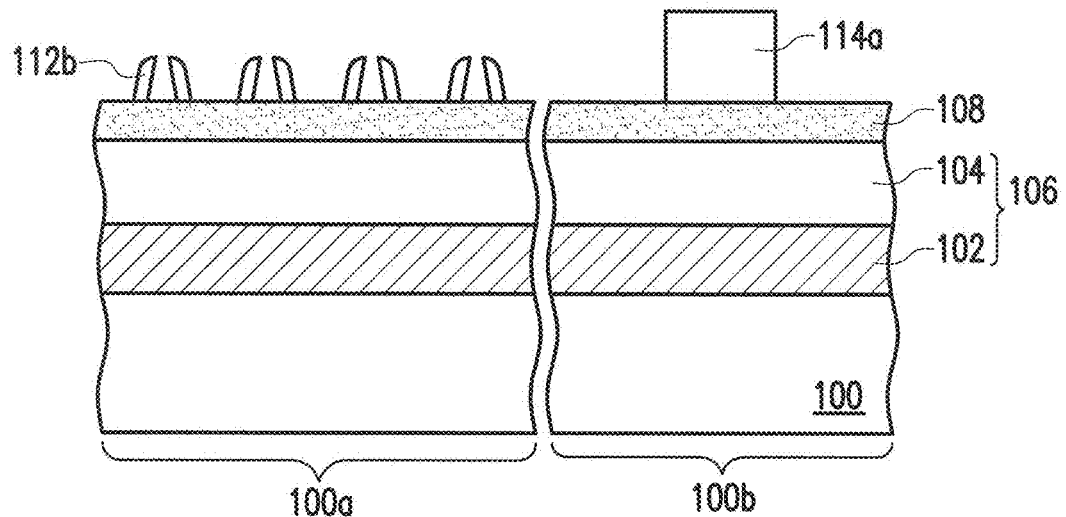

Referring to FIG. 1D, an exposure step, a post-exposure baking (PEB) step, a development step and a hard baking (HB) step are performed in sequence to the photoresist layer 114, so as to remove the photoresist layer 114 in the first area 100a and therefore expose the transfer patterns 112b. The transfer patterns 112b are as tilted as original after the photoresist layer 114 is removed. Specifically, the transfer patterns 112a in FIG. 1C are more tilted than the original due to the symmetric stress from the photoresist layer 114, and such stress is disappeared after the photoresist layer 114 is removed. Therefore, the transfer pattern 112b in FIG. 1D upon the development step have substantially the same profile as the transfer patterns 112 in FIG. 1B prior to the photoresist coating step.

At the same time, the photoresist layer 114 upon the development step defines at least one photoresist pattern 114a in the second area 100b. In an embodiment, the photoresist pattern 114a has a dimension of about 250 to 500 nm.

It is noted that the transfer patterns 112b upon the development step (or upon the hard baking step) have the same tilted sidewalls as those of the transfer patterns 112 before the photoresist coating step.

Figure 1E:
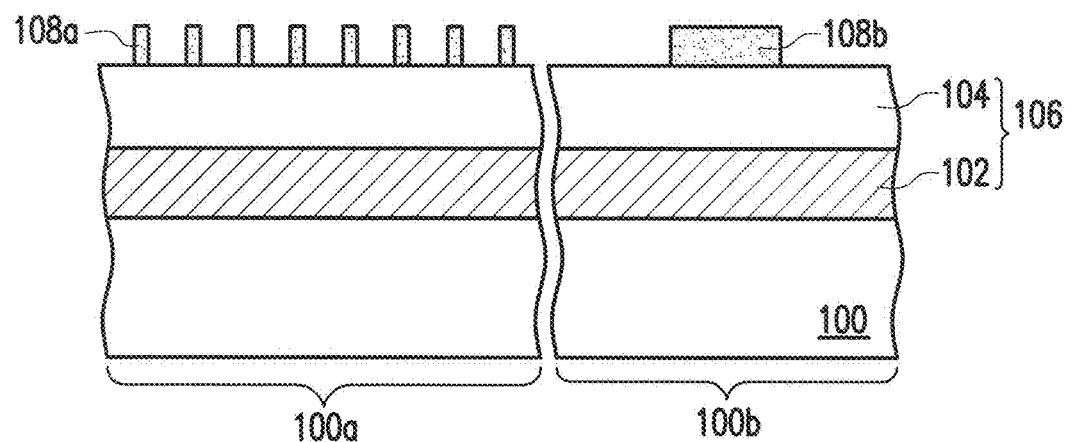

Referring to FIG. 1E, the hard mask layer 108 are patterned by using the transfer patterns 112a and the photoresist pattern 114a as a mask, so as to form a plurality of dense patterns 108a in the first area 100a and an isolated pattern 108b in the second area 100b.

Thereafter, the dense patterns 108a and the isolated pattern 108b can be transferred to the underlying layers (e.g. the upper oxide layer 104 and the lower polysilicon layer 102) through at least one etching step, and thus, target patterns are defined in the target layer.

The method of the invention can be applied to a single spacer forming technique such as a self-aligned double patterning (SADP) process, and preferably to a double spacer forming technique such as a self-aligned quadruple patterning (SAQP) process is developed when the pattern pitch is reduced to less than 38 nm.

In summary, in the method of the invention, a BARC layer is not used during the periphery pattern defining step, so that voids and therefore spacer merge issue caused by incomplete BARC filling are not observed in the array patterns. Besides, since a BARC coating step is skipped, the hard mask layer directly below the photoresist layer is preferably opaque and thick enough, so that light reflection from the underlying layers could keep a constant value during a subsequent exposure step. In such manner, the photoresist pattern in the periphery area can be formed with properties (e.g. line width roughness (LWR), line edge roughness (LER), swing ratio, critical dimension uniformity (CDU), etc.) comparable to those of the case using a BARC layer. Therefore, the pitch reduction can be successfully achieved, and the device performance can be significantly improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
    providing a substrate having a first area and a second area;
    sequentially forming a target layer and a hard mask layer on the substrate in the first area and in the second area;
    forming a plurality of transfer patterns in a spacer form on the hard mask layer in the first area;
    forming a photoresist layer directly on the hard mask layer, wherein the photoresist layer covers the transfer patterns and the hard mask layer in the first area and in the second area;
    removing the photoresist layer in the first area; and
    patterning the hard mask layer by using the transfer patterns as a mask.

2. The method of claim 1, wherein a bottom anti-reflection coating (BARC) layer is not applied before the step of forming the photoresist layer and after the step of forming the transfer patterns.

3. The method of claim 1, wherein the hard mask layer comprises amorphous silicon, polysilicon, silicon carbonitride, carbon, TiN or a combination thereof.

4. The method of claim 1, wherein the hard mask layer has an absorption value at 193 nm exposure wavelength greater than about 2.

5. The method of claim 1, wherein the hard mask layer has a thickness of equal to about 30 nm.

6. The method of claim 1, wherein the transfer patterns have an aspect ratio of about 5 to 10.

7. The method of claim 1, wherein the step of forming the transfer patterns in the spacer form comprises:
    forming a plurality of core patterns on the hard mask layer;
    forming a transfer material layer on the hard mask layer covering the core patterns;
    removing a portion of the transfer material layer, so as to form two transfer patterns as spacers on sidewalls of each core pattern; and
    removing the core patterns.

8. The method of claim 7, wherein an etch selectivity of the transfer patterns to the core patterns ranges from about 1/2 to 1/10.

9. The method of claim 1, wherein an etch selectivity of the transfer patterns to the hard mask layer ranges from about 1/2 to 1/10.

10. The method of claim 1, wherein the step of removing the photoresist layer in the first area comprises performing an exposure step and a development step to the photoresist layer.

11. The method of claim 10, wherein the photoresist layer upon the development step defines at least one photoresist pattern in the second area.

12. The method of claim 1, wherein the first area is an array area and the second area is a periphery area.

13. The method of claim 1, wherein the target layer comprises a conductive layer, a dielectric layer or a combination thereof.

14. A method of forming a semiconductor device, comprising:
   forming an opaque hard mask layer on a target layer;
   forming a plurality of separate transfer patterns on the hard mask layer, wherein the transfer patterns have slightly tilted sidewalls;
   coating a photoresist layer directly on the hard mask layer covering the transfer patterns; and
   performing an exposure step and a development step to the photoresist layer, so as to expose the transfer patterns, wherein the transfer patterns upon the development step have the same slightly tilted sidewalls.

15. The method of claim 14, wherein a bottom anti-reflection coating (BARC) layer is not applied before the step of coating the photoresist layer and after the step of forming the transfer patterns.

16. The method of claim 14, wherein the hard mask layer has an absorption value at 193 nm exposure wavelength greater than about 2.

17. The method of claim 14, wherein the hard mask layer has a thickness of equal to about 30 nm.

18. The method of claim 14, wherein the transfer patterns have an aspect ratio of about 5 to 10.

19. The method of claim 14, wherein the step of forming the transfer patterns comprises:
   forming a plurality of core patterns on the hard mask layer;
   forming a transfer material layer on the hard mask layer covering the core patterns;
   removing a portion of the transfer material layer, so as to form two transfer patterns as spacers on sidewalls of each core pattern; and
   removing the core patterns.

20. The method of claim 14, wherein the photoresist layer upon the development step defines at least one photoresist pattern in a periphery area.

* * * * *